United States Patent
Shimizu et al.

(10) Patent No.: US 10,249,718 B2
(45) Date of Patent: Apr. 2, 2019

(54) SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Tatsuo Shimizu, Shinagawa (JP); Masayasu Miyata, Kawasaki (JP); Hirotaka Nishino, Yokohama (JP); Yoshihiko Moriyama, Setagaya (JP); Yuichiro Mitani, Hayama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/891,960

(22) Filed: Feb. 8, 2018

(65) Prior Publication Data
US 2018/0308935 A1 Oct. 25, 2018

(30) Foreign Application Priority Data

Apr. 24, 2017 (JP) .................................. 2017-085422

(51) Int. Cl.
*H01L 29/16* (2006.01)
*H01L 29/66* (2006.01)
(Continued)

(52) U.S. Cl.
CPC ...... *H01L 29/1608* (2013.01); *H01L 21/0465* (2013.01); *H01L 29/167* (2013.01); *H01L 29/36* (2013.01); *H01L 29/417* (2013.01); *H01L 29/45* (2013.01); *H01L 29/6606* (2013.01); *H01L 29/66068* (2013.01); *H01L 29/7802* (2013.01); *H01L 29/868* (2013.01);
(Continued)

(58) Field of Classification Search
None
See application file for complete search history.

(56) References Cited

U.S. PATENT DOCUMENTS

| 4,451,391 A * | 5/1984 | Marinace | C23C 16/325 252/512 |
| 8,252,672 B2 * | 8/2012 | Watanabe | H01L 21/046 438/518 |

(Continued)

FOREIGN PATENT DOCUMENTS

| JP | 5418466 | 2/2014 |
| JP | 2015-20945 | 2/2015 |

(Continued)

OTHER PUBLICATIONS

Takaaki Tominaga, et al., "Establishment of Ohmic Contact Formation by Laser Annealing", The Japan Society of Applied Physics, The 61st Spring Meeting lecture proceedings, 2014, pp. 2 (with English Translation).

*Primary Examiner* — Joseph Schoenholtz
(74) *Attorney, Agent, or Firm* — Oblon, McClelland, Maier & Neustadt, L.L.P.

(57) ABSTRACT

A semiconductor device according to an embodiment includes a metal layer; an n-type first silicon carbide region; and a second silicon carbide region of metal containing at least one element selected from the group consisting of nickel (Ni), palladium (Pd), and platinum (Pt) and positioned between the metal layer and the first silicon carbide region.

25 Claims, 15 Drawing Sheets

(51) Int. Cl.
  *H01L 29/36*    (2006.01)
  *H01L 21/04*    (2006.01)
  *H01L 29/78*    (2006.01)
  *H01L 29/872*   (2006.01)
  *H01L 29/868*   (2006.01)
  *H01L 29/45*    (2006.01)
  *H01L 29/08*    (2006.01)
  *H01L 29/10*    (2006.01)
  *H01L 29/167*   (2006.01)
  *H01L 29/417*   (2006.01)

(52) U.S. Cl.
  CPC ........ *H01L 29/872* (2013.01); *H01L 21/0475* (2013.01); *H01L 21/0485* (2013.01); *H01L 29/086* (2013.01); *H01L 29/0865* (2013.01); *H01L 29/0878* (2013.01); *H01L 29/0882* (2013.01); *H01L 29/1095* (2013.01)

(56) References Cited

U.S. PATENT DOCUMENTS

| | | | |
|---|---|---|---|
| 8,823,017 | B2 | 9/2014 | Tamaso |
| 9,070,571 | B2* | 6/2015 | Lutz .................... H01L 27/0664 |
| 9,490,327 | B2 | 11/2016 | Shimizu et al. |
| 2009/0250705 | A1* | 10/2009 | Watanabe ............. H01L 21/046 257/77 |
| 2011/0193100 | A1* | 8/2011 | Tsuchiya ............... H01L 23/544 257/77 |
| 2014/0034968 | A1* | 2/2014 | Konstantinov ... H01L 29/66068 257/77 |

FOREIGN PATENT DOCUMENTS

JP  2015-153959    8/2015
WO  WO 0062331 A3 *  3/2001  ......... H01L 21/0445

\* cited by examiner

US 10,249,718 B2

SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2017-085422, filed on Apr. 24, 2017, the entire contents of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

Silicon carbide (SiC) has been expected as a material for next generation semiconductor devices. As compared with silicon (Si), silicon carbide has superior physical properties that a band gap is three times of that of Si, a breakdown field strength is about ten times of that of Si, and a thermal conductivity is about three times of that of Si. These characteristics are utilized to achieve a SiC device capable of operating with a low loss at high temperature.

In order to improve characteristics of the SiC device, it is desirable to reduce a contact resistance of a metal electrode provided on an n-type impurity region. For example, the reduction in contact resistance of a backside electrode of the vertical SiC device is important from the viewpoint of reducing an on-resistance.

DETAILED DESCRIPTION

Figure 1:
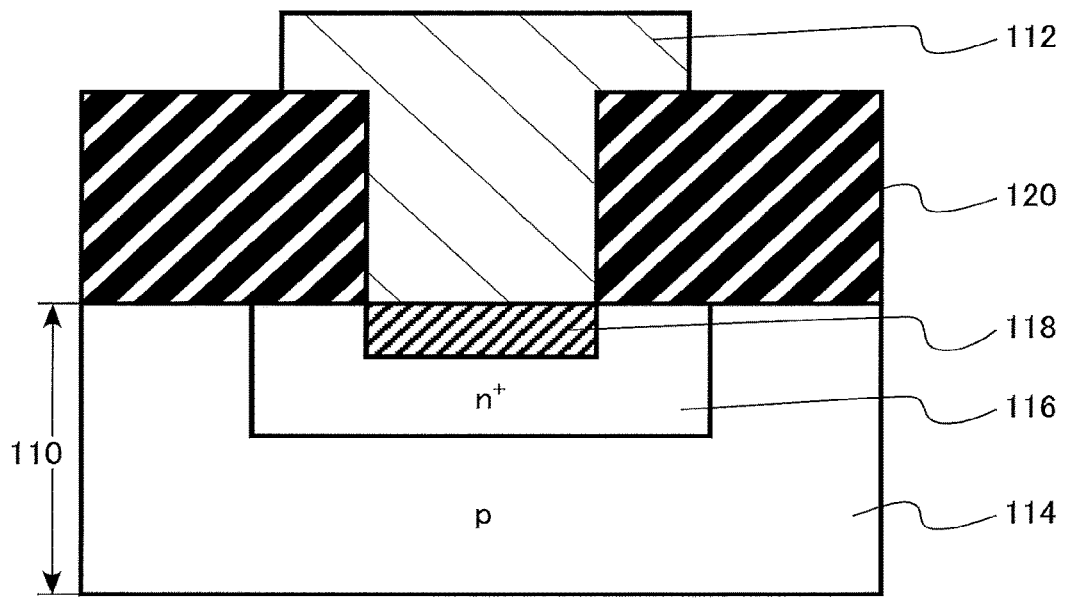
FIG. 1 is a schematic cross-sectional view of a semiconductor device of a first embodiment.

A semiconductor device according to an embodiment includes: a metal layer; an n-type first silicon carbide region; and a second silicon carbide region of metal containing at least one element selected from the group consisting of nickel (Ni), palladium (Pd), and platinum (Pt) and positioned between the metal layer and the first silicon carbide region.

Hereinafter, embodiments of the present disclosure will be described with reference to the drawings. In the following description, the same members and the like will be denoted by the same reference numerals, and members that have been once described will not be described as appropriate.

In the following description, notations $n^+$, $n$, $n^-$, $p^+$, $p$, and $p^-$ indicate relative levels of impurity concentration in each conductivity type. That is, $n^+$ indicates an n-type impurity concentration higher than that of $n$, and $n^-$ indicates an n-type impurity concentration lower than that of $n$. In addition, $p^+$ indicates a p-type impurity concentration higher than that of $p$, and $p^-$ indicates a p-type impurity concentration lower than that of $p$. In some cases, an $n^+$-type and an $n^-$-type are simply referred to as an n-type, and a $p^+$-type and a $p^-$-type are simply referred to as a p-type.

(First Embodiment)

A semiconductor device according to this embodiment includes: a metal layer; an n-type first silicon carbide region; and a second silicon carbide region of metal containing at least one element selected from the group consisting of nickel (Ni), palladium (Pd), and platinum (Pt) and positioned between the metal layer and the first silicon carbide region.

FIG. 1 is a schematic cross-sectional view of the semiconductor device of this embodiment. The semiconductor device of this embodiment has a contact structure to a silicon carbide layer. FIG. 1 is a cross-sectional view of the contact structure included in the semiconductor device of this embodiment. A kind of the semiconductor device having a contact structure of this embodiment is not particularly limited. For example, the semiconductor device may be a single transistor, a single diode, or an integrated circuit (IC) obtained by combining a plurality of transistors or a plurality of diodes.

The contact structure has a silicon carbide layer 110, a metal electrode 112 (metal layer), and an interlayer insulating layer 120.

A p-type region 114 of a p-type, an n-type region 116 of an n$^+$-type (first silicon carbide region), and a metal region 118 of metal (second silicon carbide region) are provided in the silicon carbide layer 110.

The silicon carbide layer 110 is a single crystal SiC. The silicon carbide layer 10 is, for example, a 4H—SiC.

The p-type region 114 contains, for example, aluminum (Al) as p-type impurities. A p-type impurity concentration of the p-type region 114 is, for example, $1\times10^{17}$ cm$^{-3}$ to $1\times10^{19}$ cm$^{-3}$.

The n-type region 116 of the n$^+$-type is provided between the metal electrode 112 and the p-type region 114. The n-type region 116 contains, for example, nitrogen (N) as n-type impurities. An n-type impurity concentration of the n-type region 116 is, for example, $1\times10^{18}$ cm$^{-3}$ to $1\times10^{21}$ cm$^{-3}$.

The metal region 118 is provided between the metal electrode 112 and the n-type region 116. The metal region 118 is spaced apart from the p-type region 114.

The metal region 118 is metal. The metal region 118 is metallized silicon carbide. The metal region 118 may be crystal, polycrystal, microcrystal, or amorphous.

The metal region 118 contains at least one element (hereinafter referred to as a metal impurity) selected from the group consisting of nickel (Ni), palladium (Pd), and platinum (Pt). The metal impurities are present at carbon sites of a crystal structure of silicon carbide. In other words, the metal impurities substitute carbon atoms of silicon carbide. Alternatively, the metal impurities are in carbon defects of silicon carbide.

An atomic concentration of the metal impurities in the metal region 118 is, for example, $1\times10^{19}$ cm$^{-3}$ to $5\times10^{22}$ cm$^{-3}$.

A depth of the metal region 118 is shallower than that of the n-type region 116 of the n$^+$-type, for example. A depth of the metal region 118 is, for example, 0.01 μm to 1.0 μm. A thickness of the metal region 118 is, for example, 0.01 μm to 1.0 μm. The metal region 118 is formed by a combination of ion implantation, electron ion irradiation and metal diffusion, and thus, has the depth of about 1.0 μm or less.

A sheet resistance of the metal region 118 is, for example, 0.5Ω/☐ or less. A work function of the metal region 118 is, for example, 3.7 eV or less.

The interlayer insulating layer 120 is provided on the silicon carbide layer 110. The interlayer insulating layer 120 is, for example, silicon oxide.

The metal electrode 112 is in contact with the metal region 118.

The metal electrode 112 contains metal. A material forming the metal electrode 112 is not particularly limited as long as being a material containing metal. The metal electrode 112 is, for example, metal.

Since the metal electrode 112 is in contact with the n-type region 116 via the metal region 118, it is possible to form a low-resistance contact between the metal electrode 112 and the n-type region 116 with any kind of metal irrespective of a work function of the metal electrode 112. The metal electrode 112 contains, for example, titanium (Ti) and aluminum (Al). The metal forming the metal electrode 112 is, for example, an alloy of titanium (Ti) and aluminum (Al). Metal forming the metal electrode 112 is, for example, nickel (Ni). In addition, metal silicide, such as nickel silicide (for example, NiSi, Ni$_2$Si, or NiSi$_2$) and titanium silicide (for example, TiSi), may be used. In addition, it is also possible to use metal having excellent process ability such as titanium nitride (TiN), tungsten (W), molybdenum nitride (Mo$_2$N), and phosphorus-doped polysilicon (P-doped p-Si).

Although N (nitrogen) or P (phosphorus), for example, is preferable as the n-type impurity in this embodiment, but As (arsenic), Sb (antimony), or the like can also be applied. In addition, Al (aluminum) is preferable as the p-type impurity, but B (boron), Ga (gallium), In (indium), or the like can also be applied.

An impurity type and an impurity concentration of the semiconductor body region can be measured by, for example, secondary ion mass spectrometry (SIMS) and energy dispersive X-ray spectroscopy (EDX). In addition, a relative level of the impurity concentration can also be determined based on a level of a carrier concentration obtained by, for example, scanning capacitance microscopy (SCM). In addition, a distance such as a depth and a thickness of an impurity region can be obtained by SIMS, for example. In addition, a distance such as a depth, a thickness, a width, and an interval of an impurity region can be obtained from a combined image of an SCM image and an atomic force microscope (AFM) image, for example. In addition, whether a silicon carbide region is a semiconductor or metal can be determined by SCM, for example. In addition, whether a silicon carbide region is a semiconductor or metal can be determined, for example, by measuring a temperature dependence of a resistance of the silicon carbide region. Whether the above element is present at a silicon site or a carbon site of a crystal structure of silicon carbide can be determined by X-ray photoelectron spectroscopy (XPS), for example.

Next, a method for manufacturing the semiconductor device of this embodiment will be described.

In the method for manufacturing the semiconductor device of this embodiment includes, performing ion implantation of at least one element selected from the group consisting of nickel (Ni), palladium (Pd), and platinum (Pt) into a portion of an n-type first silicon carbide region, performing heat treatment after the ion implantation of the at least one element and metallizing the portion to form a second silicon carbide region of metal, and forming a metal layer on the second silicon carbide region.

FIGS. 2 to 6 are schematic cross-sectional views illustrating the semiconductor device in the middle of being manufactured in the method for manufacturing the semiconductor device of this embodiment.

Hereinafter, a case where the at least one element is nickel (Ni) will be described as an example.

Figure 2:
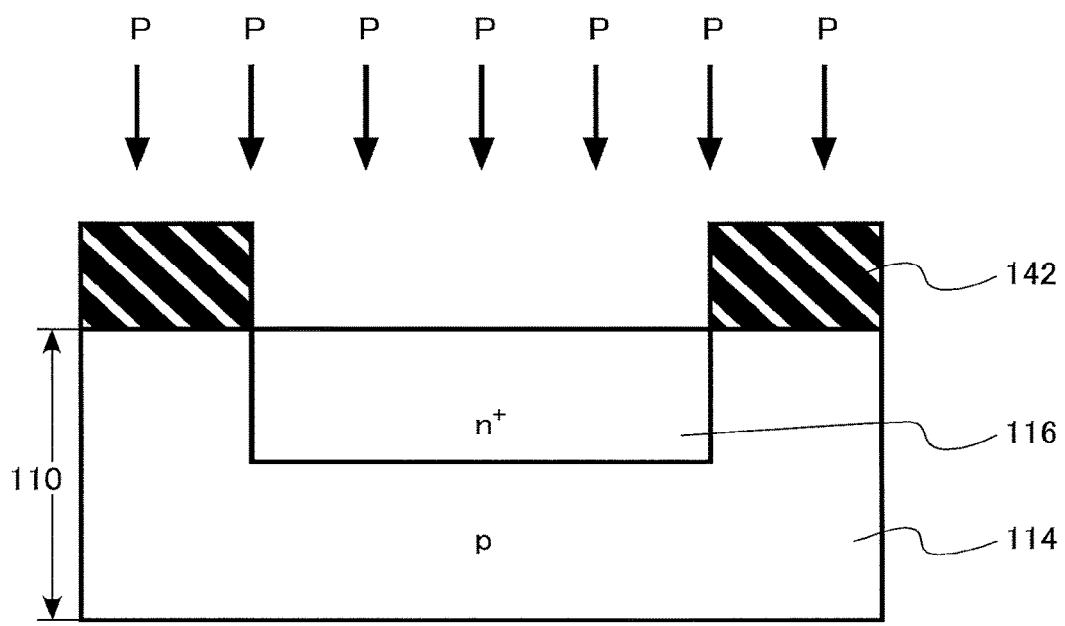
FIG. 2 is a schematic cross-sectional view illustrating the semiconductor device in the middle of being manufactured in a method for manufacturing the semiconductor device of the first embodiment.

First, a first mask material 142 made of, for example, silicon oxide is formed on the silicon carbide layer 10 including the p-type region 114 by patterning using photolithography and etching. Next, phosphorus (P) as the n-type impurity is ion-implanted into the p-type region 114 using this first mask material 142 as an ion implantation mask, thereby forming the n-type region 116 (first silicon carbide region) (FIG. 2).

Next, high-temperature annealing is performed. In the high-temperature annealing, the n-type impurity of the n-type region 116 is activated. Conditions of the high-temperature annealing are, for example, an inert gas atmosphere such as an argon (Ar) gas, heating temperature of 1600° C. to 2000° C., and heating time of 10 minutes to 60 minutes.

Figure 3:
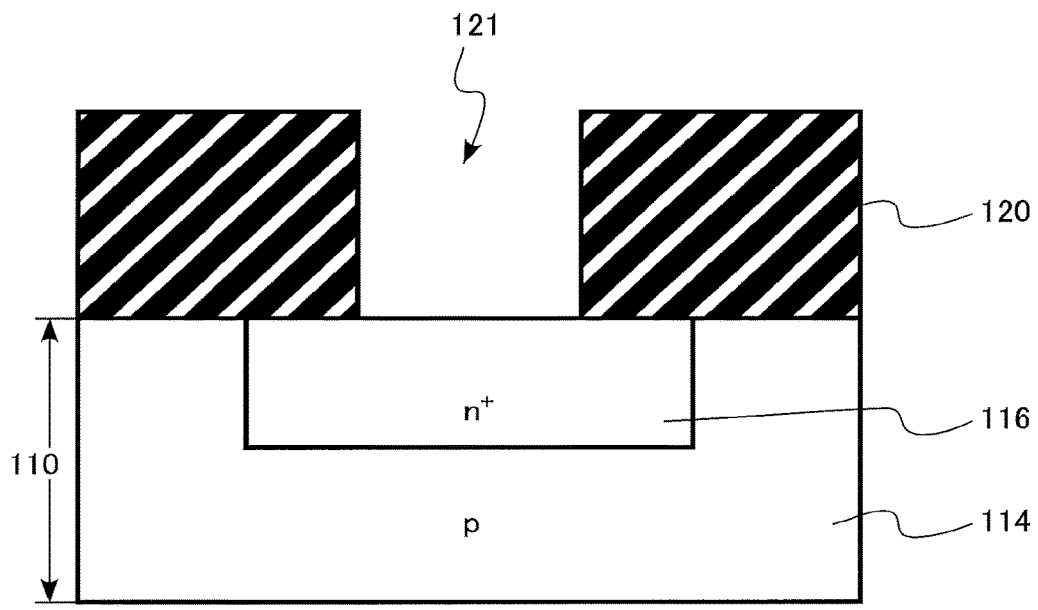
FIG. 3 is a schematic cross-sectional view illustrating the semiconductor device in the middle of being manufactured in the method for manufacturing the semiconductor device of the first embodiment.

Next, the interlayer insulating layer 120 is deposited on the silicon carbide layer 10. The interlayer insulating layer 120 is, for example, silicon oxide. Next, a contact hole 121 is formed in the interlayer insulating layer 120 by patterning using photolithography and etching (FIG. 3).

Figure 4:
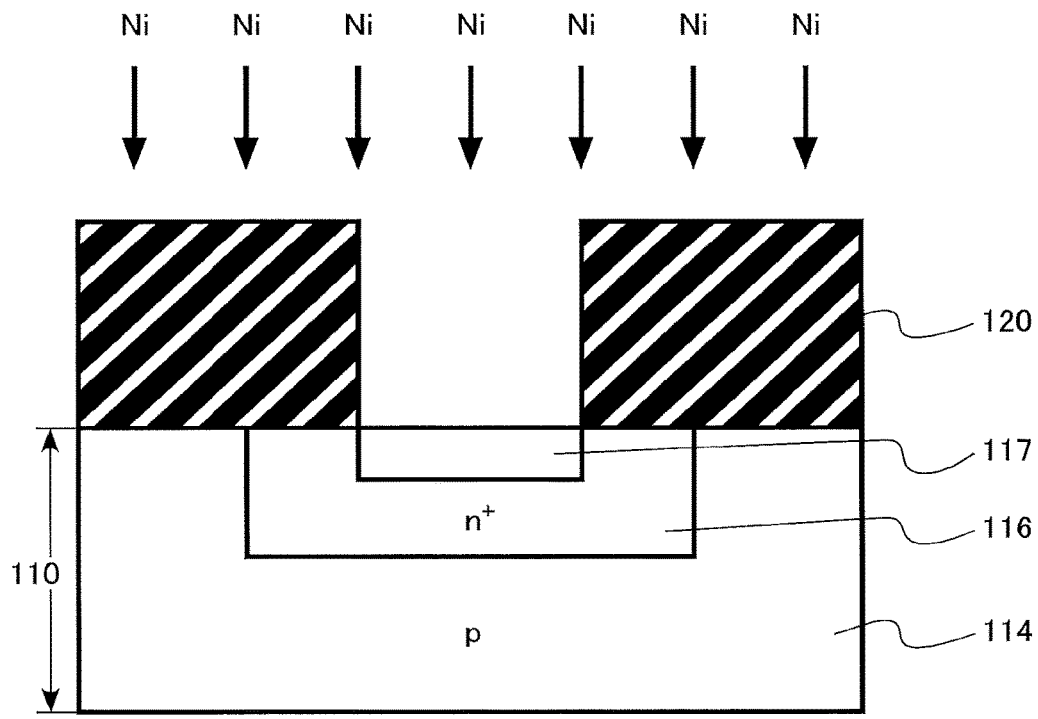
FIG. 4 is a schematic cross-sectional view illustrating the semiconductor device in the middle of being manufactured in the method for manufacturing the semiconductor device of the first embodiment.

Next, nickel (Ni) is ion-implanted into the n-type region 116 using the interlayer insulating layer 120 as an ion implantation mask, thereby forming a metal impurity region 117 (FIG. 4).

Figure 5:
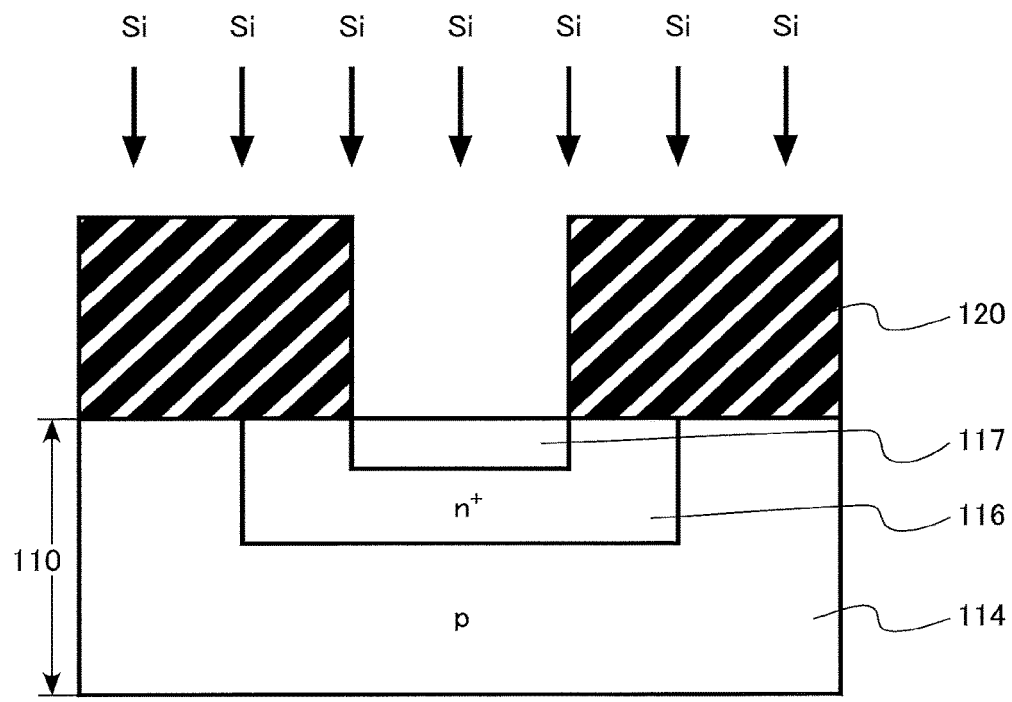
FIG. 5 is a schematic cross-sectional view illustrating the semiconductor device in the middle of being manufactured in the method for manufacturing the semiconductor device of the first embodiment.

Next, silicon (Si) is ion-implanted into the metal impurity region 117 using the interlayer insulating layer 120 as an ion implantation mask (FIG. 5).

Figure 6:
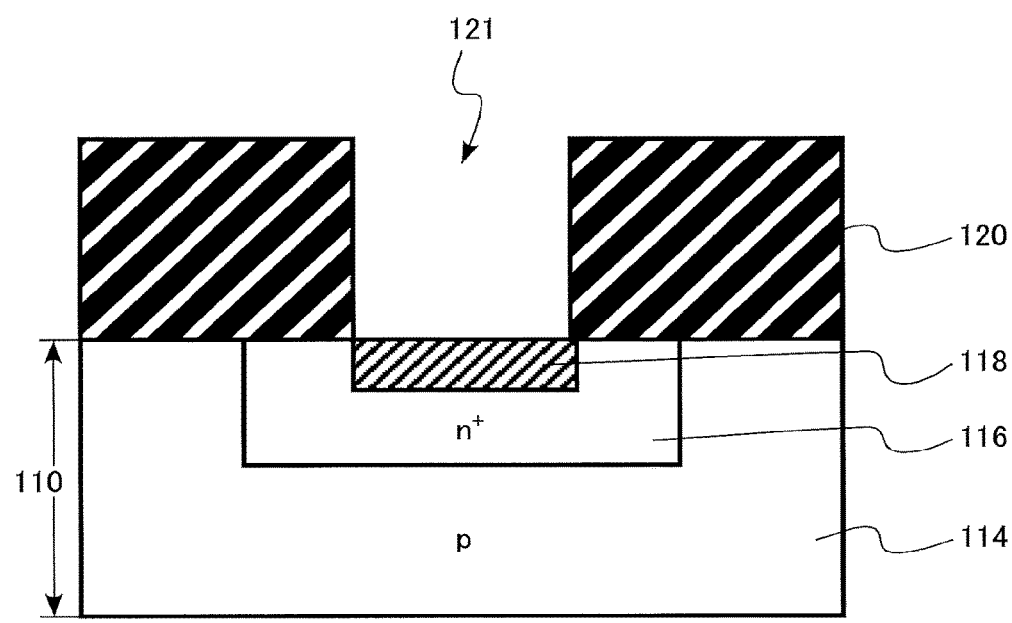
FIG. 6 is a schematic cross-sectional view illustrating the semiconductor device in the middle of being manufactured in the method for manufacturing the semiconductor device of the first embodiment.

Next, low-temperature annealing is performed. The metal impurity region 117 is metallized by the low-temperature annealing to form the metal region 118 (FIG. 6).

The temperature of the low-temperature annealing is lower than the temperature of the high temperature annealing. Conditions of the low-temperature annealing are, for example, an inert gas atmosphere such as an argon (Ar) gas, heating temperature of 600° C. to 900° C., and heating time of 10 minutes to 60 minutes.

Next, the metal electrode 112 is formed inside the contact hole 121. The metal electrode 112 is formed, for example, by deposition of a metal material using a sputtering method and patterning using photolithography and etching. The metal electrode 112 is formed by sputtering and patterning of Ti (titanium) and Al (aluminum), for example.

Next, electrode annealing is performed in order to reduce a contact resistance of the metal electrode 112. Conditions of the electrode annealing are, for example, an argon gas atmosphere and temperature of 300° C. to 500° C.

With the above manufacturing method, the contact structure illustrated in FIG. 1 is formed.

Hereinafter, a function and an effect of this embodiment will be described in detail.

There is a request for reduction in contact resistance of a metal electrode provided on an n-type impurity region in order to improve characteristics of a SiC device. However, a potential energy at conduction band minimum of SiC is smaller than that of Si. Thus, there is no suitable metal material having a work function to realize low barrier-height to the n-type impurity region, and it is difficult to form the metal electrode having a low contact resistance as compared with the case of Si. In the contact structure of this embodiment, the contact resistance of the metal electrode is reduced by metallizing a part of the n-type impurity region.

As a result of studies conducted by the inventors based on first principle calculation, it has been found that SiC as a semiconductor is metallized by entering of at least one element (metal impurity) selected from the group consisting of nickel (Ni), palladium (Pd), and platinum (Pt). Hereinafter, a case where the above element (metal impurity) is nickel (Ni) will be described as an example.

Figure 7A:
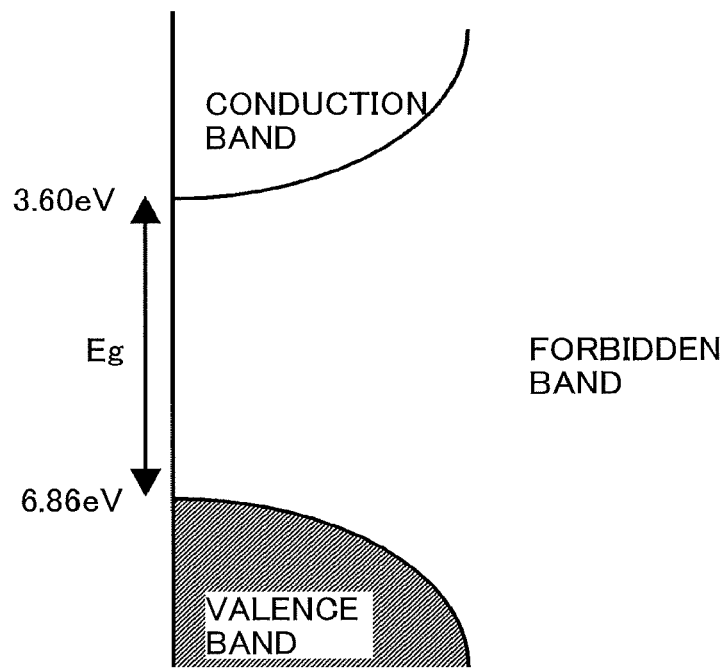
FIGS. 7A and 7B are diagrams illustrating a function of the first embodiment.
Figure 7B:
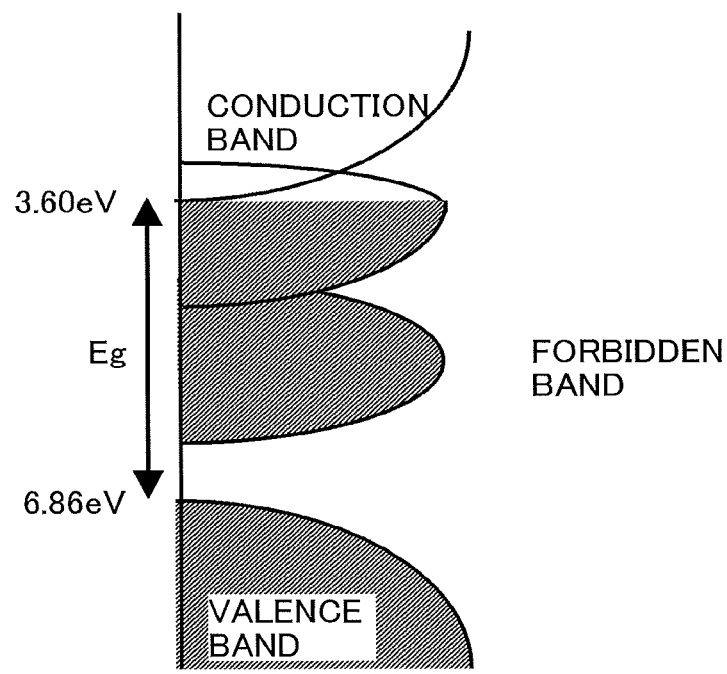

FIGS. 7A and 7B are diagrams illustrating the function of this embodiment. FIG. 7A is a band diagram of silicon carbide (SiC) in the case of containing no metal impurity. FIG. 7B is a band diagram when the metal impurity enters a carbon site of a crystal structure of silicon carbide. Both FIG. 7A and FIG. 7B illustrate an energy level density and an energy level filling state with an electron. The region indicated by hatching in FIGS. 7A and 7B illustrates a state where the energy levels are filled with electrons.

According to the first principle calculation, SiC is metallized as nickel enters a site of carbon, and a work function thereof becomes 3.7 eV or less. This work function is approximately equal to 3.60 eV, which is a potential energy measured from a vacuum level at conduction band minimum of SiC.

This state is considered to be realized as newly formed energy levels in a forbidden band of SiC are filled with electrons supplied from nickel as illustrated in FIG. 7B. It is considered that the energy level formed in a band gap of SiC is caused due to dangling bond of silicon formed by generation of carbon defects.

The carbon defects are generated, for example, by damage of ion implantation that introduces impurities into SiC. When the carbon defects occur, empty energy levels appear near the conduction band minimum of SiC in the forbidden band of SiC. It is considered that the empty energy levels are filled as the electrons are supplied to the empty energy levels from nickel entering the carbon site, thereby metallizing SiC.

Nickel in SiC is more stable in an equilibrium state in the case of entering the silicon site or an interstitial site than in the case of entering the carbon site. When nickel enters the silicon site or the interstitial site, SiC is not metallized but remains as the semiconductor.

For example, it is preferable to introduce nickel into SiC by ion implantation and generate a large amount of carbon defects using ion implantation damage in order to metallize SiC by introducing nickel. Nickel is likely to enter the carbon site by generating the carbon defects, which prevents nickel from entering the silicon site.

In addition, for example, it is considered that irradiation of SiC with an electron beam prior to heat treatment is effective in terms of generating a large amount of carbon defects.

It is preferable to introduce silicon together with nickel into SiC from the viewpoint of promoting the metallization of SiC by introducing nickel.

Figure 8:
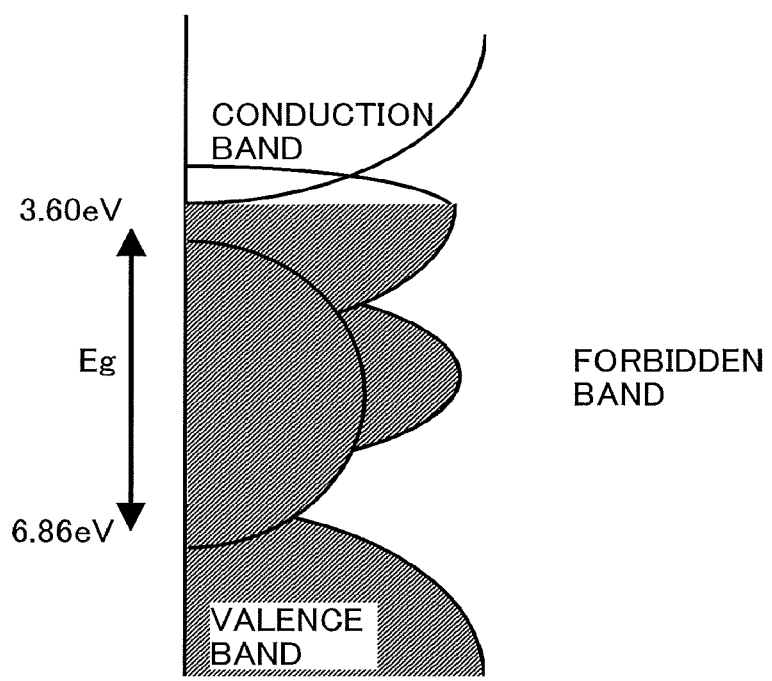
FIG. 8 is a diagram illustrating the function of the first embodiment.

FIG. 8 is a diagram illustrating the function of this embodiment. FIG. 8 illustrates an energy level density and an energy level filling state with an electron when silicon is introduced together with nickel into SiC. The region indicated by hatching in FIG. 8 illustrates a state where the energy levels are filled with electrons.

According to the first principle calculation, new energy levels are further formed in the forbidden band of SiC by introducing silicon as illustrated in FIG. 8. The newly formed energy level is formed so as to fill a portion between the energy level formed by introducing nickel and a valence band. Therefore, the resistance of the metallized SiC is further reduced.

In addition, nickel enters the carbon site more easily than the silicon site of SiC by co-doping nickel and silicon due to a site competition effect. Therefore, the metallization of SiC is promoted.

Although the description has been given by exemplifying nickel (Ni) as the element that metallizes SiC, it has been confirmed by the first principle calculation that the same function can be obtained with palladium (Pd) and platinum (Pt).

For example, there is a case where metal silicide is formed in the n-type impurity region by deposition of a metal film to be silicided, such as nickel, on SiC and heat treatment in order to reduce the contact resistance. In this case, carbon clusters are precipitated at the interface between the n-type impurity region and SiC. Such carbon clusters may cause an increase in interfacial resistance between the metal electrode and SiC and peeling of a film of the metal electrode.

In this embodiment, the metal region 118, which is the metallized SiC, is provided between the metal electrode 112 and the n-type region 116 as illustrated in FIG. 1.

As described above, a work function of the metallized SiC is approximately equal to 3.60 eV, which is a potential energy measured from a vacuum level at conduction band minimum of SiC. Therefore, a work function of the metal region 118 and the potential energy measured from the vacuum level at the conduction band minimum of the semiconductor source region 28 are substantially equal.

For this reason, an energy barrier between the metal region 118 and the n-type region 116 disappears or becomes extremely small. Accordingly, the interfacial resistance between the metal region 118 and the n-type region 116 also decreases. Accordingly, the contact resistance of the metal electrode 112 with respect to the n-type region 116 is reduced.

The fact that the metal having a lower resistance than, for example, silicide or the like is provided between the metal electrode 112 and the n-type region 116 also contributes to the reduction in contact resistance.

In addition, the metallized SiC is excellent in oxidation resistance. Therefore, the reliability of the semiconductor device having the above contact structure is also improved.

Further, a boundary between the metal region 118 and the n-type region 116, made of the same SiC, becomes a continuous interface, and no carbon cluster is formed. Therefore, it is possible to avoid the problems of an increase in interfacial resistance and the film peeling caused by the formation of carbon clusters. From this viewpoint as well, the reliability of the semiconductor device having the above contact structure is improved.

An atomic concentration of metal impurities in the metal region 118 is preferably $1 \times 10^{19}$ cm$^{-3}$ to $5 \times 10^{22}$ cm$^{-3}$ and more preferably $5 \times 10^{19}$ cm$^{-3}$ to $5 \times 10^{21}$ cm$^{-3}$, for example. When falling below the above range, there is a risk that the metal region 118 is not sufficiently metallized. In addition, the introduction of metallic impurities exceeding the above range is problematic because there is a possibility of exceeding a solid solution limit.

In addition, the sheet resistance of the metal region 118 is preferably 0.5Ω/□ or less from the viewpoint of reducing the contact resistance. The sheet resistance of the metal region 118 is more preferably 0.1Ω/□ or less, and even more preferably 0.05Ω/□ or less.

In addition, the work function of the metal region 118 is preferably 3.7 eV (electron volt) or less from the viewpoint of reducing the barrier between the metal region 118 and the n-type region 116 and reducing the contact resistance. The work function of the metal region 118 is more preferably 3.6 eV (electron volt) or less.

The temperature of low-temperature annealing after the introduction of metal impurity is preferably 600° C. to 900° C., and more preferably 700° C. to 800° C. When falling below the above range, there is a risk that the metal impurity does not enter the carbon site. In addition, when exceeding the above range, there is a possibility that the metal impurity is likely to enter the silicon site rather than the carbon site.

Further, the metal impurity at the carbon site is more stable in the case of co-doping the metal impurity and silicon. Therefore, for example, it is also possible to form the metal region 118 by high-temperature annealing of, for example, 1000° C. or higher and up to 1800° C. or lower, if necessary, after the introduction of metal impurities. For example, it is conceivable to perform annealing at 1800° C. when it is desired to perform annealing to form the metal region 118 at the same time as annealing to activate a dopant.

On the other hand, the annealing at low temperature of 900° C. or lower is preferable when it is desired to form the metal region 118 after forming a device structure such as an insulating film and a SiC substrate interface as in this embodiment.

An ion implantation dose of silicon is preferably five times or more, and more preferably ten times or more of an ion implantation dose of nickel from the viewpoint of making the metal impurity enter the carbon site more easily than the silicon site of SiC.

As described above, according to the semiconductor device and the method for manufacturing the same of this embodiment, it is possible to reduce the contact resistance by providing the metal SiC between the metal electrode and the n-type impurity region. In addition, it is possible to realize the highly reliable contact structure. Accordingly, it is possible to realize the highly reliable semiconductor device having excellent characteristics. In addition, the interface between the SiC metal region and the metal electrode is in a uniform state since a reaction such as silicidation is not used. When the SiC metal region is not applied, a reaction at the interface between metal and SiC may be used to reduce the contact resistance. Accordingly, barriers, carbon defects, and the like are randomly distributed at the interface, which may cause instability of barrier height between metal and SiC.

(Second Embodiment)

A semiconductor device of this embodiment includes: a first electrode; a second electrode; a first silicon carbide region positioned between the first electrode and the second electrode; an n-type second silicon carbide region positioned between the first silicon carbide region and the second electrode and having a higher n-type impurity concentration than that of the first silicon carbide region; and a third silicon carbide region of metal containing at least one element selected from the group consisting of nickel (Ni), palladium (Pd), and platinum (Pt), and positioned between the second silicon carbide region and the second electrode.

In the semiconductor device of this embodiment, a metal region similar to that of the first embodiment is provided on a backside electrode of a vertical device. Hereinafter, the content overlapping with that in the first embodiment will not be described.

Figure 9:
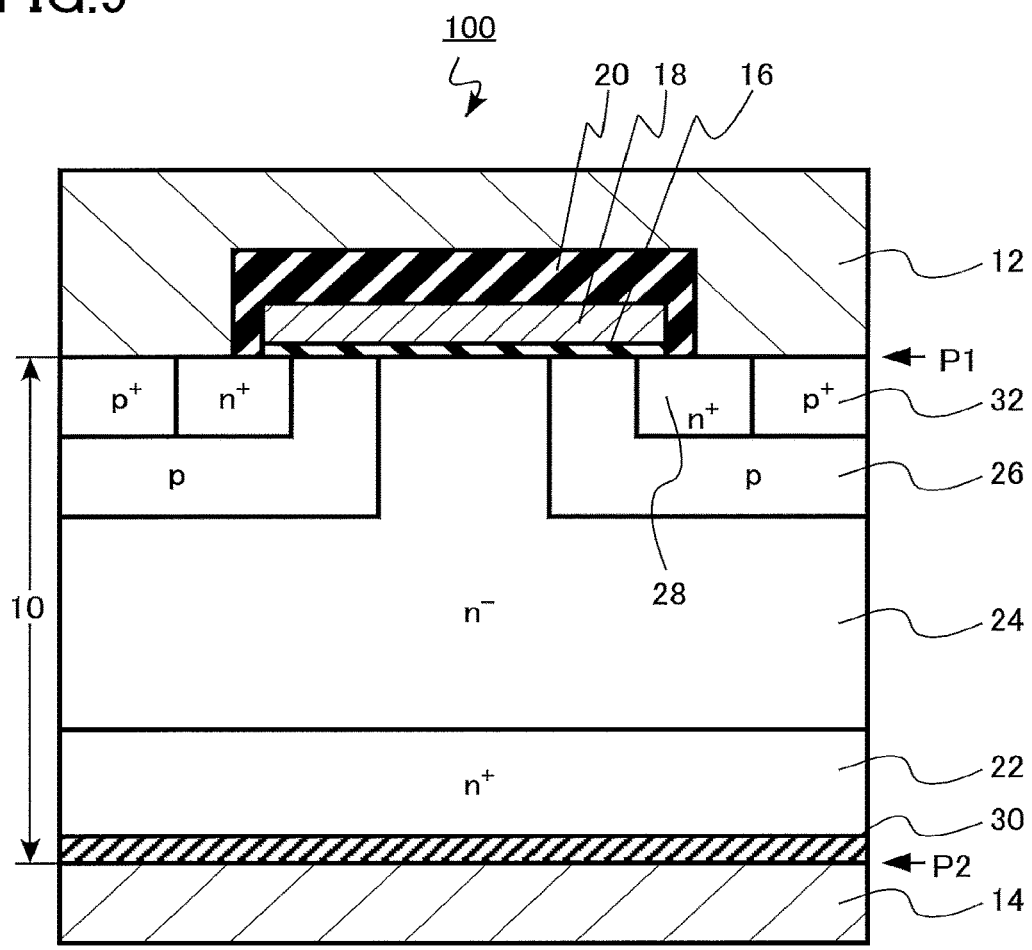
FIG. 9 is a schematic cross-sectional view of a semiconductor device of a second embodiment.

FIG. 9 is a schematic cross-sectional view of the semiconductor device of this embodiment. This semiconductor device is a planar gate vertical MOSFET using silicon carbide. A MOSFET 100 is, for example, a double implantation MOSFET (DIMOSFET) in which a p-type body region and an n-type source region are formed by ion implantation.

The MOSFET 100 includes a silicon carbide layer 10, a source electrode 12 (first electrode), a drain electrode 14 (second electrode), a gate insulating layer 16, a gate electrode 18, and an interlayer insulating layer 20.

An n$^+$-type drain region 22 (second silicon carbide region), an n$^-$-type drift region 24 (first silicon carbide region), a p-type body region 26, an n$^+$-type source region 28, a metal region 30 (third silicon carbide region), and a p$^+$-type body contact region 32 are provided in the silicon carbide layer 10.

At least a part of the silicon carbide layer 10 is provided between the source electrode 12 and the drain electrode 14. At least a part of the silicon carbide layer 10 is provided between the gate electrode 18 and the drain electrode 14. The silicon carbide layer 10 is a single crystal SiC. The silicon carbide layer 10 is, for example, a 4H—SiC.

The silicon carbide layer 10 has a first face ("P1" in FIG. 9) and a second face ("P2" in FIG. 9). Hereinafter, the first face is also referred to as a front surface, and the second face is referred to as a back surface. Hereinafter, a "depth" means a depth set with the first face as a reference.

The first face is, for example, a face inclined by 0° to 8° with respect to a (0001) face. In addition, the second face is, for example, a face inclined by 0° to 8° with respect to a (000-1) face. The (0001) face is referred to as a silicon face. The (000-1) face is referred to as a carbon face.

The n-type drain region 22 is provided on the back side of the silicon carbide layer 10. The drain region 22 contains, for example, nitrogen (N) as n-type impurities. An n-type impurity concentration of the drain region 22 is, for example, $1 \times 10^{18}$ cm$^{-3}$ to $1 \times 10^{21}$ cm$^{-3}$.

The n$^-$ type drift region 24 is provided on the drain region 22. The drift region 24 contains, for example, nitrogen (N) as n-type impurities. An n-type impurity concentration of the drift region 24 is lower than the n-type impurity concentration of the drain region 22. The n-type impurity concentration of the drift region 24 is, for example, $4 \times 10^{14}$ cm$^{-3}$ to $1 \times 10^{17}$ cm$^{-3}$. A thickness of the drift region 24 is, for example, 5 μm to 150 μm.

The body region 26 is provided between the source electrode 12 and the drift region 24. A contact face between the body region 26 and the gate insulating layer 16 functions as a channel region of the MOSFET 100.

The body region 26 contains, for example, aluminum (Al) as p-type impurities. A p-type impurity concentration of the body region 26 is, for example, $1 \times 10^{17}$ cm$^{-3}$ to $1 \times 10^{19}$ cm$^{-3}$.

A depth of the body region 26 is, for example, 0.3 μm to 0.8 μm.

The source region 28 is provided between the source electrode 12 and the body region 26. The source region 28 is spaced apart from the drift region 24.

The source region 28 contains, for example, phosphorus (P) as n-type impurities. An n-type impurity concentration of the source region 28 is higher than the n-type impurity concentration of the drift region 24.

The n-type impurity concentration of the source region 28 is, for example, $1 \times 10^{19}$ cm$^{-3}$ to $1 \times 10^{21}$ cm$^{-3}$. A depth of the semiconductor source region 28 is shallower than the depth of the body region 26 and is, for example, 0.1 μm to 0.3 μm.

The source region 28 is fixed, for example, to the potential of the source electrode 12.

The p$^+$-type body contact region 32 is provided between the source electrode 12 and the body region 26. A p-type impurity concentration of the body contact region 32 is higher than the p-type impurity concentration in the body region 26.

The body contact region 32 contains, for example, aluminum (Al) as p-type impurities. The p-type impurity concentration in the body contact region 32 is, for example, $1 \times 10^{19}$ cm$^{-3}$ to $1 \times 10^{21}$ cm$^{-3}$.

A depth of the body contact region 32 is, for example, 0.3 μm to 0.6 μm.

The body contact region 32 is fixed, for example, to the potential of the source electrode 12.

The metal region 30 is provided between the drain region 22 and the drain electrode 14. The metal region 30 is metal. The metal region 30 is metallized silicon carbide.

The metal region 30 contains at least one element (hereinafter referred to as a metal impurity) selected from the group consisting of nickel (Ni), palladium (Pd), and platinum (Pt). The metal impurities are present at carbon sites of a crystal structure of silicon carbide. In other words, the metal impurities substitute carbon atoms of silicon carbide. Alternatively, the metal impurities are in carbon defects of silicon carbide.

An atomic concentration of the metal impurities in the metal region 30 is, for example, $1 \times 10^{19}$ cm$^{-3}$ to $5 \times 10^{22}$ cm$^{-3}$. A thickness of the metal region 30 is, for example, 0.01 μm to 1.0 μm.

A sheet resistance of the metal region 30 is, for example, 0.5Ω/☐ or less. A work function of the metal region 30 is, for example, 3.7 eV or less.

The gate electrode 18 is a conductive layer. The gate electrode 18 is, for example, polycrystalline silicon containing p-type impurities or n-type impurities.

The gate insulating layer 16 is provided between the gate electrode 18 and the body region 26. In addition, the gate insulating layer 16 is provided between the gate electrode 18 and the drift region 24. The gate insulating layer 16 contacts the body region 26, for example.

The gate insulating layer 16 is, for example, silicon oxide. For example, a high-k insulating material (high dielectric constant insulating material) can be applied as the gate insulating layer 16.

The interlayer insulating layer 20 is provided on the gate electrode 18. The interlayer insulating layer 20 is, for example, silicon oxide.

The source electrode 12 is in contact with the source region 28. In addition, the source electrode 12 contacts the body contact region 32.

The source electrode 12 contains metal. The source electrode 12 contains, for example, titanium (Ti) and aluminum (Al). The metal forming the source electrode 12 is, for example, an alloy of titanium (Ti) and aluminum (Al).

The drain electrode 14 is provided on the back surface of the silicon carbide layer 10. The drain electrode 14 is in contact with the metal region 30.

The drain electrode 14 contains metal. A material for forming the drain electrode 14 is not particularly limited as long as being a material containing metal. The drain electrode 14 is, for example, metal.

Since the drain electrode 14 is in contact with the n$^+$-type drain region 22 via the metal region 30, it is possible to form the low-resistance contact between the drain electrode 14 and the drain region 22 with any kind of metal irrespective of a work function of the drain electrode. The metal forming the drain electrode 14 is, for example, metal or an alloy containing titanium (Ti), aluminum (Al), nickel (Ni), silver (Ag), or gold (Au). In addition, metal silicide, such as nickel silicide (for example, NiSi, Ni$_2$Si, or NiSi$_2$) and titanium silicide (for example, TiSi), may be used. In addition, it is also possible to use metal having excellent process ability such as titanium nitride (TiN), tungsten (W), molybdenum nitride (Mo$_2$N), and phosphorus-doped polysilicon (P-doped p-Si).

Although N (nitrogen) or P (phosphorus), for example, is preferable as the n-type impurity in this embodiment, but As (arsenic), Sb (antimony), or the like can also be applied. In addition, Al (aluminum) is preferable as the p-type impurity, but B (boron), Ga (gallium), In (indium), or the like can also be applied.

Next, a method for manufacturing the semiconductor device of this embodiment will be described.

FIGS. 10 to 14 are schematic cross-sectional views illustrating the semiconductor device in the middle of being manufactured in the method for manufacturing the semiconductor device of this embodiment.

Hereinafter, a case where the at least one element is nickel (Ni) will be described as an example.

Figure 10:
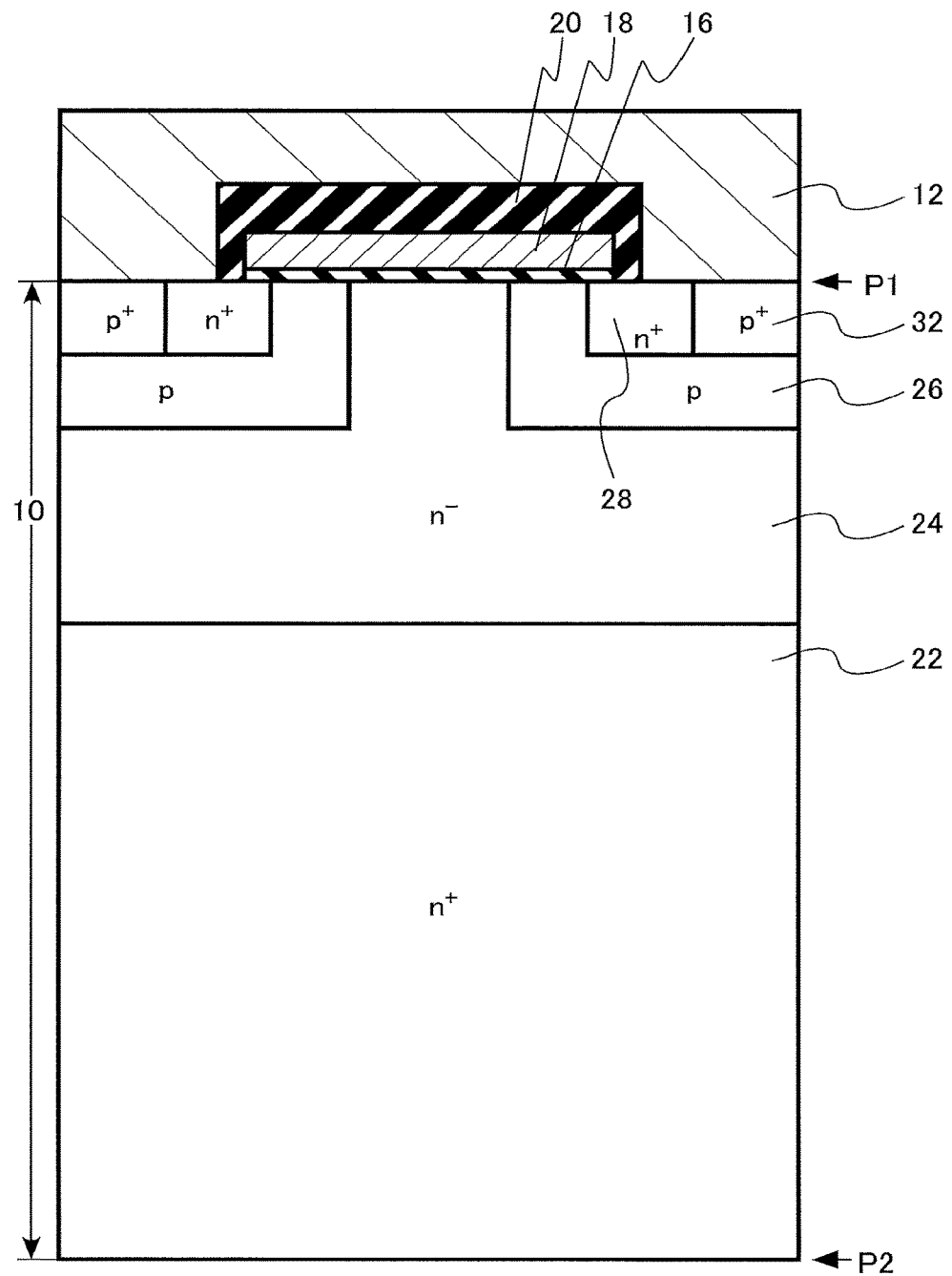
FIG. 10 is a schematic cross-sectional view illustrating the semiconductor device in the middle of being manufactured in a method for manufacturing the semiconductor device of the second embodiment.

First, the silicon carbide layer 10 including the n$^+$-type drain region 22 and the n$^-$ type drift region 24 is prepared. A thickness of the silicon carbide layer 10 is, for example, 300 μm to 500 μm. Next, the p-type body region 26, the n$^+$-type source region 28, the p$^+$-type body contact region 32, the source electrode 12 (first electrode), the drain electrode 14 (second electrode), the gate insulating layer 16, the gate electrode 18, and the interlayer insulating layer 20 are formed using known manufacturing methods (FIG. 10).

Figure 11:
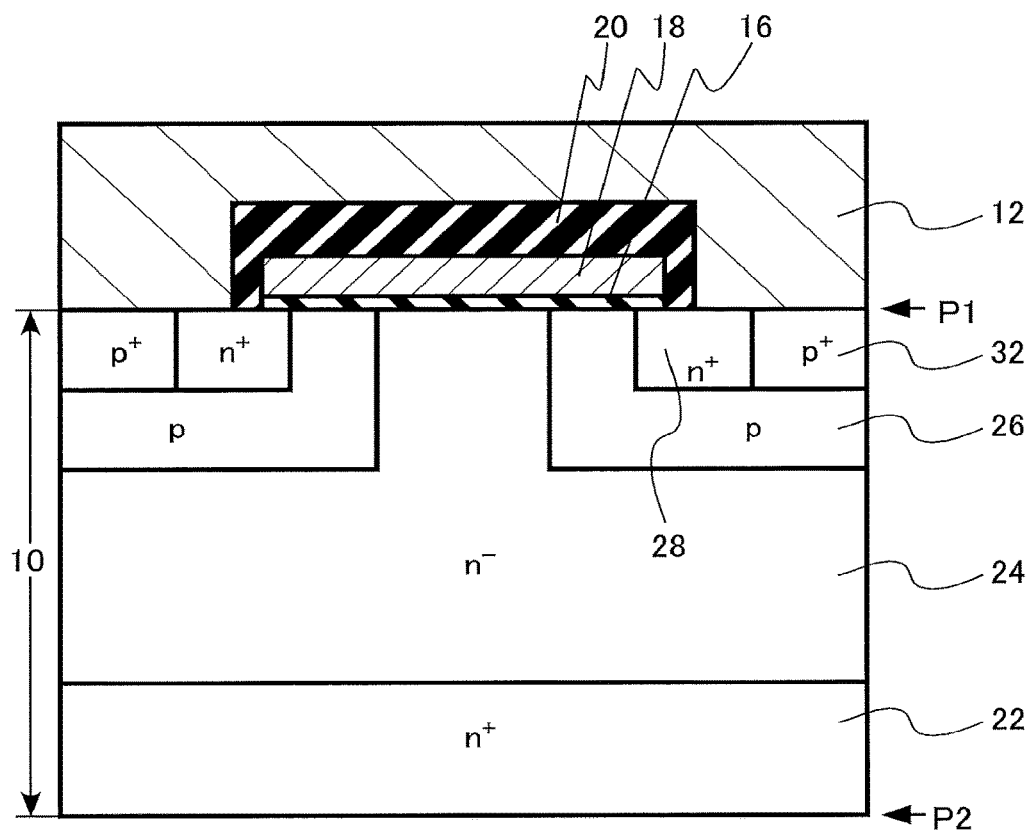
FIG. 11 is a schematic cross-sectional view illustrating the semiconductor device in the middle of being manufactured in the method for manufacturing the semiconductor device of the second embodiment.

Next, the silicon carbide layer 10 is thinned (FIG. 11). In other words, the n$^+$-type drain region 22 is made thin. The n$^+$-type drain region 22 is cut from the back side of the n+-type drain region 22 by back grinding or a chemical mechanical polishing (CMP) method to thin the n$^+$-type drain region 22. For example, the n$^+$-type drain region 22 is thinned to about 90 μm.

Figure 12:
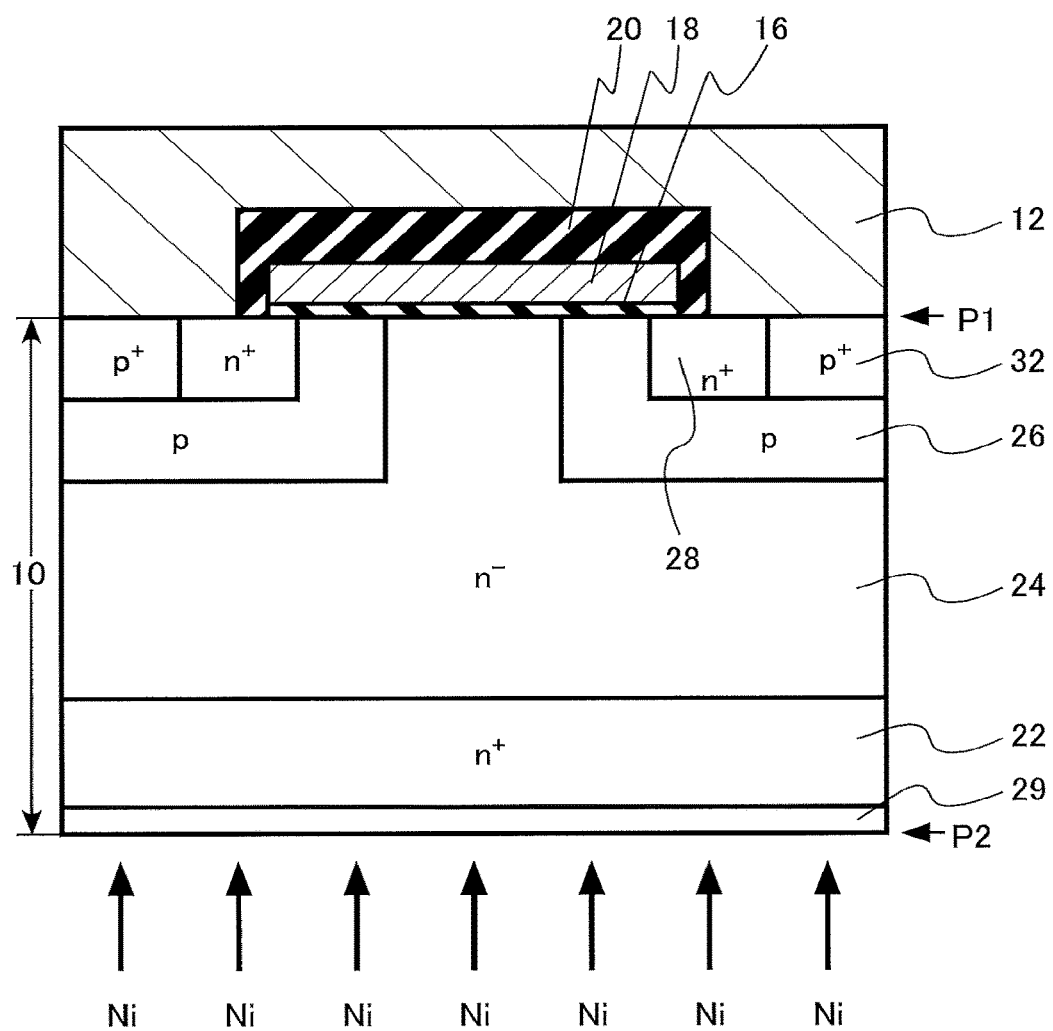
FIG. 12 is a schematic cross-sectional view illustrating the semiconductor device in the middle of being manufactured in the method for manufacturing the semiconductor device of the second embodiment.

Next, nickel (Ni) is ion-implanted into the drain region 22 from the back side of the silicon carbide layer 10 to form a metal impurity region 29 (FIG. 12).

Figure 13:
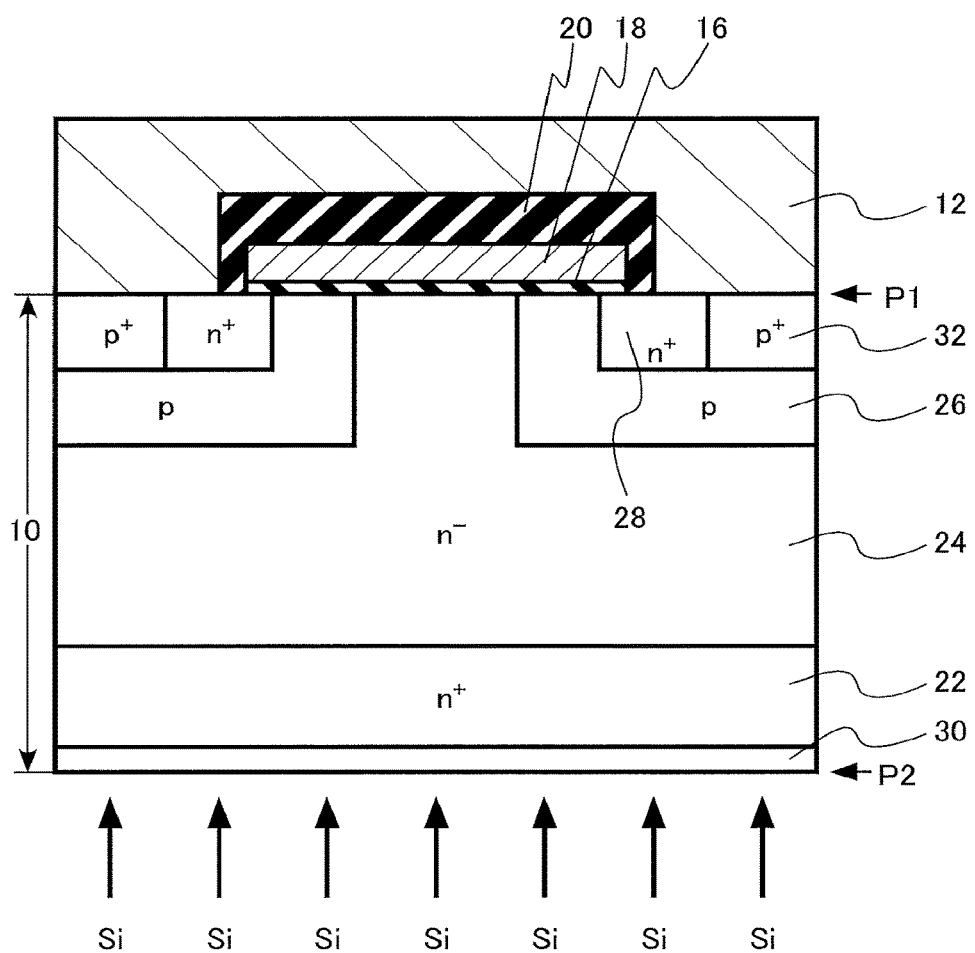
FIG. 13 is a schematic cross-sectional view illustrating the semiconductor device in the middle of being manufactured in the method for manufacturing the semiconductor device of the second embodiment.

Next, silicon (Si) is ion-implanted into the metal impurity region 29 from the back side of the silicon carbide layer 10 (FIG. 13).

Figure 14:
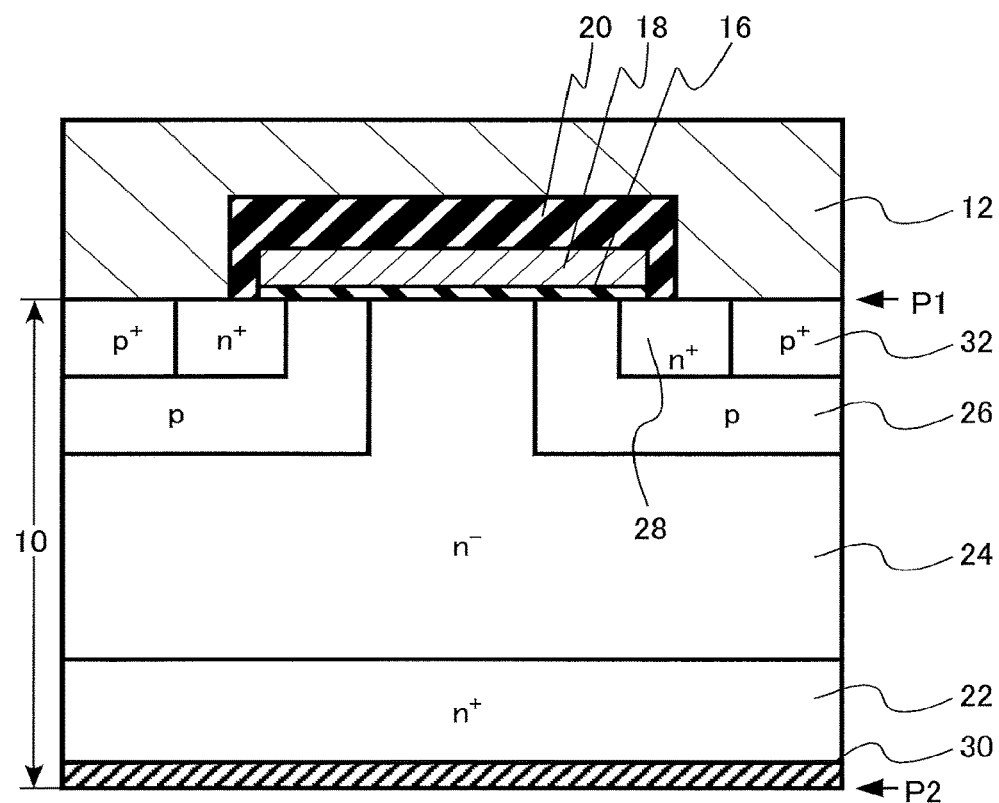
FIG. 14 is a schematic cross-sectional view illustrating the semiconductor device in the middle of being manufactured in the method for manufacturing the semiconductor device of the second embodiment.

Next, low-temperature annealing is performed. The metal impurity region 29 is metallized by low-temperature annealing to form metal region 30 (FIG. 14).

Next, the conductive drain electrode 14 is formed on a side of the silicon carbide layer 10 opposite to the source electrode 12. In other words, the drain electrode 14 is formed with the drift region 24 interposed between the drain electrode 14 and the source electrode 12. The drain electrode 14 is formed by, for example, sputtering of a metal material. The metal material is, for example, nickel (Ni).

Next, low-temperature annealing is performed in order to reduce a contact resistance between the source electrode 12 and the drain electrode 14. The low-temperature annealing is performed, for example, in an argon gas atmosphere at 300° C. to 500° C.

The MOSFET 100 illustrated in FIG. 9 is formed according to the above manufacturing method.

In the vertical SiC device including the metal electrodes on the upper and lower sides of the silicon carbide layer 10 as in this embodiment, it is expected to reduce the contact resistance of the backside electrode and to improve the reliability of the backside electrode.

When the drain electrode is formed on the n$^+$-type silicon carbide layer by the deposition of the metal film and the heat treatment, there is no suitable metal material having a work function corresponding to the conduction band minimum of the n-type SiC semiconductor layer such as the n$^+$-type drift region. Thus, there is a risk that the energy barrier may remain between the metal layer of the drain electrode and the n$^+$-type silicon carbide layer so that it is difficult to sufficiently reduce the contact resistance of the drain electrode.

In addition, when the drain electrode is formed by the deposition of the metal film and the heat treatment, it is desirable to perform the heat treatment at temperature of 1000° C. or higher in order to reduce the contact resistance. However, when the heat treatment at 1000° C. or higher is performed after the formation of the MOS structure on the front surface, adverse effects to device characteristics are concerned, for example, hydrogen which has terminated the interface between the silicon carbide layer and the gate insulating film is detached and a threshold variation occurs.

Regarding the threshold variation, it is also considered a method of performing heat treatment in a hydrogen-containing atmosphere at less than 1000° C., for example, after the formation of the drain electrode. According to this method, hydrogen can terminate the interface between the silicon carbide layer and the gate insulating film again. In this case, however, there is a new problem that the number of manufacturing steps increases.

Further, carbon clusters are precipitated at the interface between the drain electrode and the silicon carbide layer when the drain electrode is formed, for example, by the deposition of the metal film to be silicided, such as nickel, and the heat treatment. Such carbon clusters may cause an increase in contact resistance between the drain electrode and the silicon carbide layer and the film peeling of the drain electrode.

In addition, the silicon carbide layer is thinned before the drain electrode formation in order to reduce an on-resistance of the MOSFET. In this case, there is a limit to the thinning from the viewpoint of handling of a wafer and suppression of warpage so that it is concerned that it is difficult to sufficiently reduce the on-resistance.

In this embodiment, the metal region 30 which is the metallized SiC is provided between the drain electrode 14 and the drain region 22 as illustrated in FIG. 9. Therefore, the energy barrier between the drain electrode 14 and the n$^+$-type drain region 22 disappears or becomes extremely small. Accordingly, it is possible to reduce the contact resistance between the drain electrode 14 and the drain region 22.

In addition, the metal region 30 of this embodiment can be formed at low temperature of less than 1000° C., for example, at temperature of 800° C. or lower. Thus, it is possible to form the low-resistance interface at low temperature. Therefore, it is possible to form the drain electrode 14 without affecting the device characteristics such as the threshold variation. Accordingly, it is unnecessary to provide the additional manufacturing step such as the heat treatment in the hydrogen-containing atmosphere after the formation of the drain electrode 14.

Further, the boundary between the drain region 22 and the metal region 30 becomes a continuous interface, and no carbon cluster is formed at the time of forming the drain electrode 14. Therefore, it is possible to avoid the problems of an increase in contact resistance and the film peeling caused by the formation of carbon clusters.

In addition, the metal region 30 of this embodiment is formed by ion-implanting the above element into the n$^+$-type drain region 22. In other words, a part of the n$^+$-type drain region 22 is converted into the metal region 30. Therefore, the resistance of the n$^+$-type drain region 22 is substantially reduced. Accordingly, it is possible to reduce the on-resistance of the MOSFET 100 even if there is a limit in the thinning of the n$^+$-type drain region 22.

An atomic concentration of metal impurities in the metal region 30 is preferably $1 \times 10^{19}$ cm$^{-3}$ to $5 \times 10^{22}$ cm$^{-3}$, and more preferably $5 \times 10^{19}$ cm$^{-3}$ to $5 \times 10^{21}$ cm$^{-3}$, for example. When falling below the above range, there is a risk that the metal region 30 is not sufficiently metallized. In addition, the introduction of metallic impurities exceeding the above range is problematic because there is a possibility of exceeding a solid solution limit.

In addition, the sheet resistance of the metal region 30 is preferably 0.5Ω/□ or less from the viewpoint of reducing the on-resistance of the MOSFET 100. The sheet resistance of the metal region 118 is more preferably 0.1 Ω/□ or less, and even more preferably 0.05Ω/□ or less.

In addition, the work function of the metal region 30 is preferably 3.7 eV (electron volt) or less from the viewpoint of reducing the barrier between the metal region 30 and the drain region 22 and reducing the contact resistance. The work function of the metal region 118 is more preferably 3.6 eV (electron volt) or less.

The temperature of low-temperature annealing after the introduction of metal impurity is preferably 600° C. to 900° C., and more preferably 700° C. to 800° C. When falling below the above range, there is a risk that the metal impurity does not enter the carbon site. In addition, when exceeding the above range, there is a possibility that the metal impurity is likely to enter the silicon site rather than the carbon site. In addition, if the temperature is low as in the above range, it is possible to form the metal region 30 without affecting the device characteristics such as the threshold variation.

An ion implantation dose of silicon is preferably five times or more, and more preferably ten times or more of an ion implantation dose of nickel from the viewpoint of making the metal impurity enter the carbon site more easily than the silicon site of SiC.

As described above, it is possible to reduce the contact resistance of the backside electrode of the MOSFET according to the semiconductor device and the method for manufacturing the same of this embodiment. In addition, it is possible to suppress the variation in device characteristics in the backside electrode formation using the low-temperature manufacturing method. In addition, the film peeling of the backside electrode is suppressed, and the reliability of the MOSFET is improved. In addition, the on-resistance of the MOSFET is reduced, and the high-performance MOSFET is realized. In addition, the interface between the SiC metal region and the metal electrode is in a uniform state since a reaction such as silicidation is not used.

(Third Embodiment)

A semiconductor device of this embodiment is different from that of the second embodiment in terms of being a merged PiN Schottky (MPS) diode. A configuration of a backside electrode and a manufacturing method thereof are the same as those of the second embodiment. Therefore, some of the content overlapping with that in the second embodiment will not be described.

Figure 15:
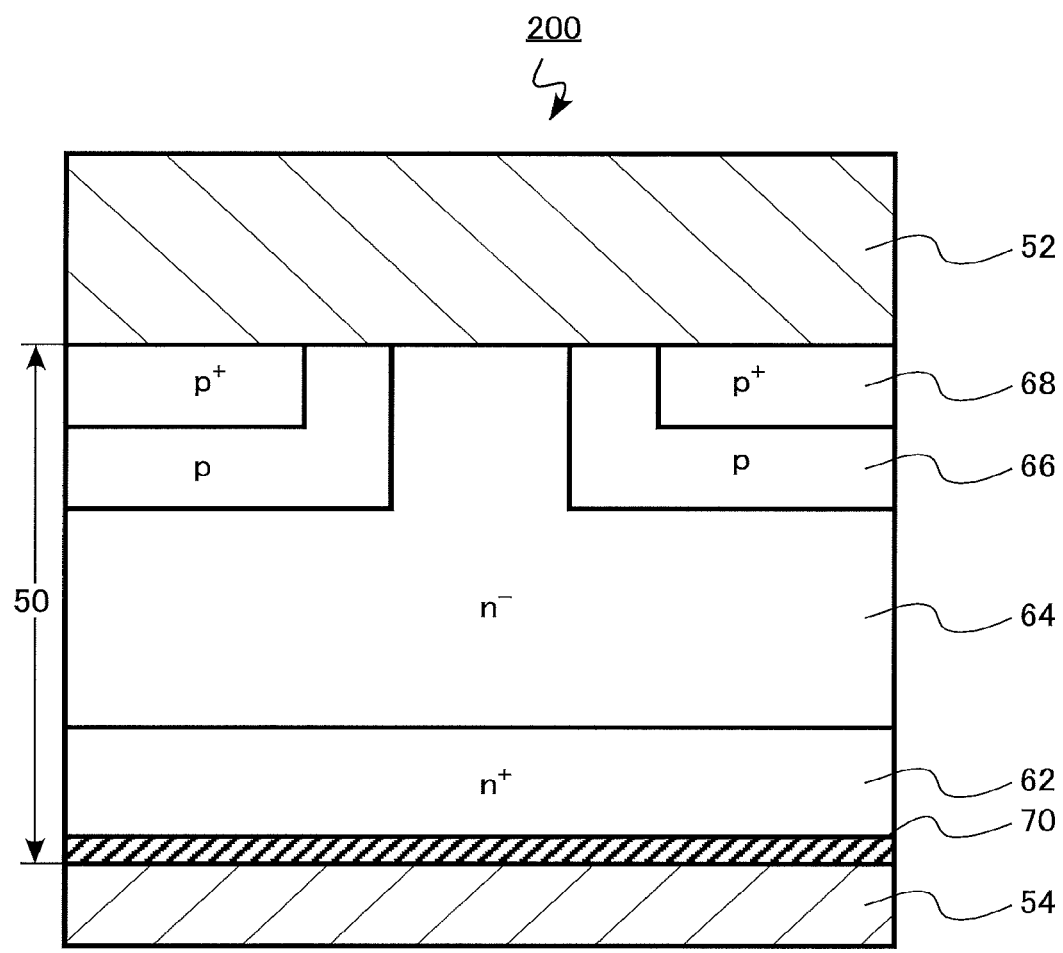
FIG. 15 is a schematic cross-sectional view of a semiconductor device of a third embodiment.

FIG. 15 is a schematic cross-sectional view illustrating a configuration of the MPS diode which is the semiconductor device of this embodiment.

An MPS diode 200 includes a silicon carbide layer 50, an anode electrode 52 (first electrode), and a cathode electrode 54 (second electrode). The cathode electrode 54 is the backside electrode.

An $n^+$-type cathode region 62 (second silicon carbide region), an $n^-$ type drift region 64 (first silicon carbide region), a p-type anode region 66, a $p^+$-type anode contact region 68, and a metal region 70 are provided in the silicon carbide layer 50.

The metal region 70 is provided between the cathode region 62 and the cathode electrode 54. The metal region 70 is metal. The metal region 70 is metallized silicon carbide.

The metal region 70 contains at least one element (hereinafter referred to as a metal impurity) selected from the group consisting of nickel (Ni), palladium (Pd), and platinum (Pt). The metal impurities are present at carbon sites of a crystal structure of silicon carbide. In other words, the metal impurities substitute carbon atoms of silicon carbide. Alternatively, the metal impurities are in carbon defects of silicon carbide.

As described above, it is possible to reduce a contact resistance of the backside electrode of the MPS diode according to the semiconductor device and the method for manufacturing the same of this embodiment. It is possible to suppress a variation in device characteristics in backside electrode formation using the low-temperature manufacturing method. In addition, film peeling of the backside electrode is suppressed, and reliability of the MPS diode is improved. In addition, an on-resistance of the MPS diode is reduced, and the high performance MPS diode is realized. In addition, the interface between the SiC metal region and the metal electrode is in a uniform state since a reaction such as silicidation is not used.

(Fourth Embodiment)

An inverter circuit and a driving device of this embodiment correspond to a driving device including the semiconductor device of the second embodiment.

Figure 16:
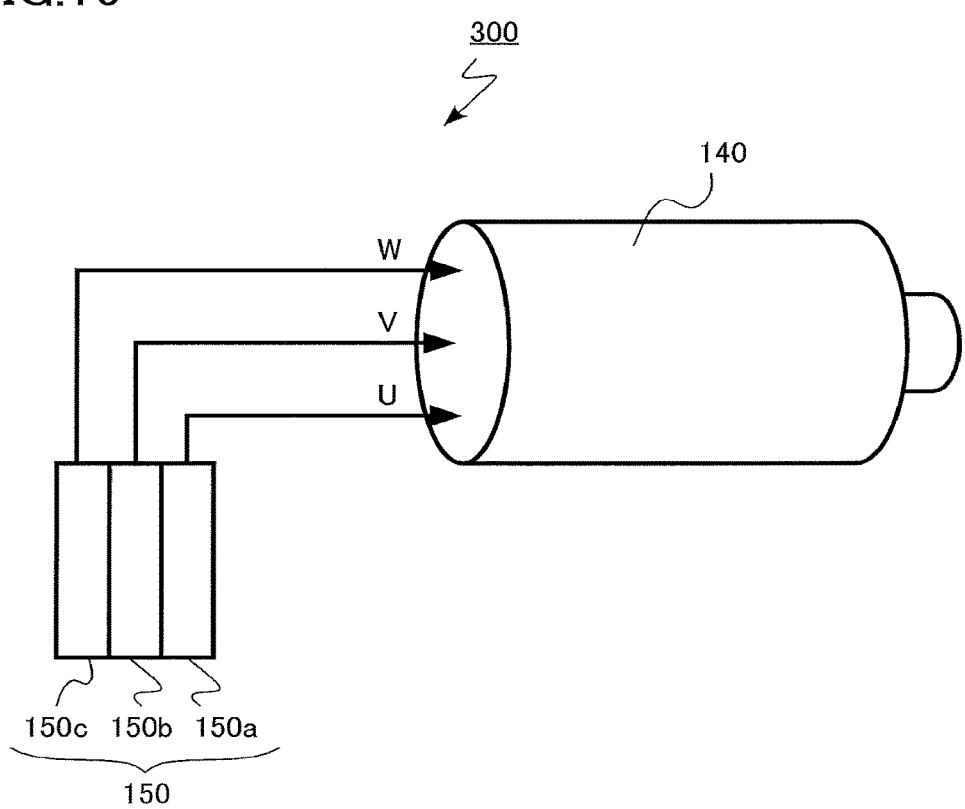
FIG. 16 is a schematic diagram of a driving device of a fourth embodiment.

FIG. 16 is a schematic diagram of the driving device of this embodiment. A driving device 300 includes a motor 140 and an inverter circuit 150.

The inverter circuit 150 includes three semiconductor modules 150a, 150b, and 150c using the MOSFET 100 of the second embodiment as a switching element. The three-phase inverter circuit 150 having three AC voltage output terminals U, V, and W is realized by connecting the three semiconductor modules 150a, 150b, and 150c in parallel. The motor 140 is driven by the AC voltage output from the inverter circuit 150.

According to this embodiment, characteristics of the inverter circuit 150 and the driving device 300 are improved by providing the MOSFET 100 with improved characteristics.

(Fifth Embodiment)

A vehicle of this embodiment is a vehicle including the semiconductor device of the second embodiment.

Figure 17:
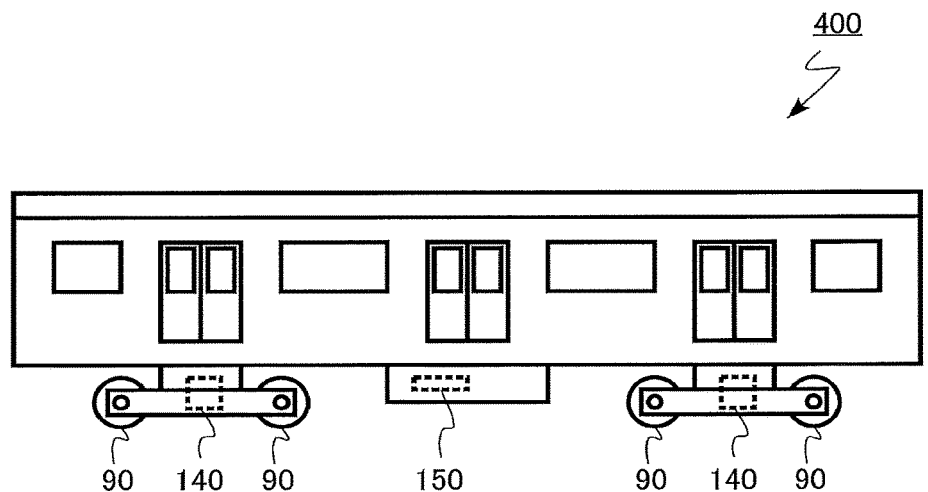
FIG. 17 is a schematic diagram of a vehicle of a fifth embodiment.

FIG. 17 is a schematic diagram of the vehicle of this embodiment. A vehicle 400 of this embodiment is a railway vehicle. The vehicle 400 includes the motor 140 and the inverter circuit 150.

The inverter circuit 150 includes three semiconductor modules using the MOSFET 100 of the second embodiment as a switching element. The three-phase inverter circuit 150 having three AC voltage output terminals U, V, and W is realized by connecting the three semiconductor modules in parallel. The motor 140 is driven by the AC voltage output from the inverter circuit 150. The wheels 90 of the vehicle 400 are rotated by the motor 140.

According to this embodiment, characteristics of the vehicle 400 are improved by providing the MOSFET 100 with improved characteristics.

(Sixth Embodiment)

A vehicle of this embodiment is a vehicle including the semiconductor device of the second embodiment.

Figure 18:
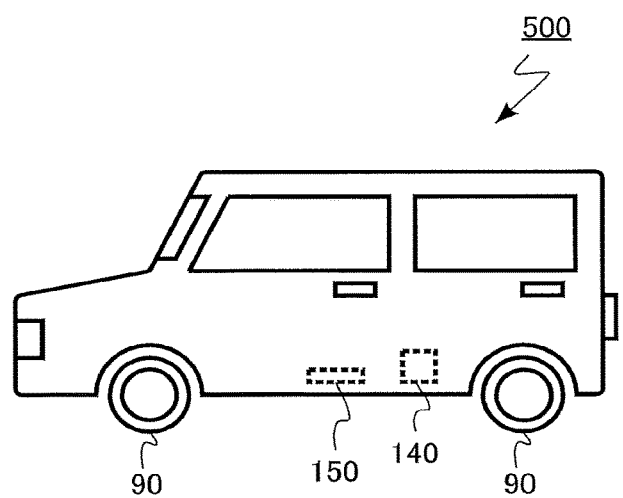
FIG. 18 is a schematic diagram of a vehicle of a sixth embodiment.

FIG. 18 is a schematic diagram of the vehicle of this embodiment. A vehicle 500 according to this embodiment is a car. The vehicle 500 includes the motor 140 and the inverter circuit 150.

The inverter circuit 150 includes three semiconductor modules using the MOSFET 100 of the second embodiment as a switching element. The three-phase inverter circuit 150 having three AC voltage output terminals U, V, and W is realized by connecting the three semiconductor modules in parallel.

The motor 140 is driven by the AC voltage output from the inverter circuit 150. The wheels 90 of the vehicle 500 are rotated by the motor 140.

According to this embodiment, characteristics of the vehicle 500 are improved by providing the MOSFET 100 with improved characteristics.

(Seventh Embodiment)

An elevator of this embodiment is an elevator including the semiconductor device of the second embodiment.

Figure 19:
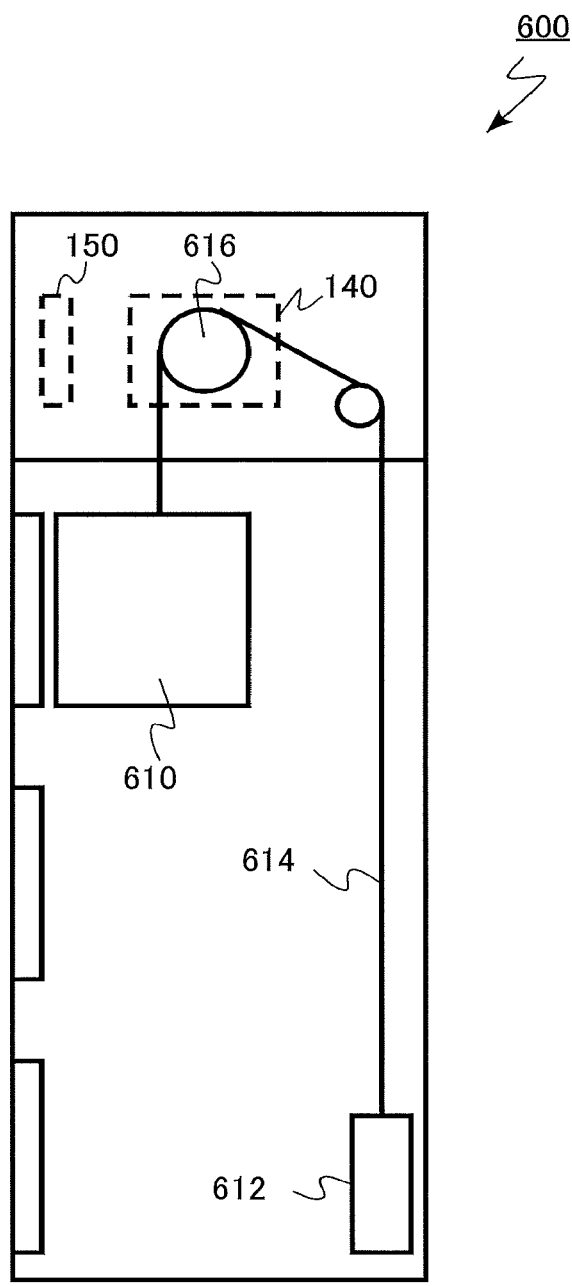
FIG. 19 is a schematic diagram of an elevator of a seventh embodiment.

FIG. 19 is a schematic diagram of the elevator of this embodiment. An elevator 600 of this embodiment includes an elevator car 610, a counterweight 612, a wire rope 614, a hoisting machine 616, a motor 140, and the inverter circuit 150.

The inverter circuit 150 includes three semiconductor modules using the MOSFET 100 of the second embodiment as a switching element. The three-phase inverter circuit 150 having three AC voltage output terminals U, V, and W is realized by connecting the three semiconductor modules in parallel.

The motor 140 is driven by the AC voltage output from the inverter circuit 150. The hoisting machine 616 is rotated by the motor 140 to move the elevator car 610 up and down.

According to this embodiment, characteristics of the elevator 600 are improved by providing the MOSFET 100 with improved characteristics.

As described above, the description has been given in the embodiments by exemplifying the case of 4H—SiC as the crystal structure of silicon carbide, but the present disclosure can also be applied to silicon carbide having other crystal structures such as 6H—SiC and 3C—SiC.

In addition, the description has been given in the second embodiment by exemplifying the n-channel planar MOSFET, but the present disclosure can also be applied to a backside electrode of an n-channel trench MOSFET.

In addition, the description has been given in the second embodiment by exemplifying the MPS diode, but the present disclosure can also be applied to backside electrodes of other diodes, for example, a PiN diode, a Schottky barrier diode, a junction barrier Schottky (JBS) diode, and a transparent diode.

In addition, it is also possible to adopt a configuration in which a MOSFET and a diode are formed on the same substrate. In this case, for example, it is possible to make a backside electrode common and to make the diode function as a freewheeling diode.

In addition, the description has been given in the fourth to seventh embodiments by exemplifying the case where the semiconductor device of the present disclosure is applied to a vehicle or an elevator, but the semiconductor device of the present disclosure can also be applied to, for example, a power conditioner of a photovoltaic power generation system or the like.

While certain embodiments have been described, these embodiments have been presented by way of example only, and are not intended to limit the scope of the inventions. Indeed, the semiconductor device, the method for manufacturing the semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a metal layer;
an n-type first silicon carbide region; and
a second silicon carbide region of metal containing at least one element selected from the group consisting of nickel (Ni), palladium (Pd), and platinum (Pt) and positioned between the metal layer and the first silicon carbide region,
wherein
the at least one element is present at a carbon site of a crystal structure of silicon carbide.

2. A semiconductor device comprising:
a metal layer;
an n-type first silicon carbide region; and
a second silicon carbide region of metal containing at least one element selected from the group consisting of nickel (Ni), palladium (Pd), and platinum (Pt) and positioned between the metal layer and the first silicon carbide region, wherein
the second silicon carbide region contains silicon (Si) present at a carbon site of a crystal structure of silicon carbide.

3. A semiconductor device comprising:
a metal layer;
an n-type first silicon carbide region; and
a second silicon carbide region of metal containing at least one element selected from the group consisting of nickel (Ni), palladium (Pd), and platinum (Pt), and positioned between the metal layer and the first silicon carbide region, wherein
a concentration of the at least one element in the second silicon carbide region is $1\times10^{19}$ cm$^{-3}$ to $5\times10^{22}$ cm$^{-3}$.

4. The semiconductor device according to claim 3, wherein
a thickness of the second silicon carbide region is 0.01 μm to 1.0 μm.

5. A semiconductor device comprising:
a metal layer;
an n-type first silicon carbide region; and
a second silicon carbide region of metal containing at least one element selected from the group consisting of nickel (Ni), palladium (Pd), and platinum (Pt) and positioned between the metal layer and the first silicon carbide region, wherein
a sheet resistance of the second silicon carbide region is 0.5 Ω/☐ or less.

6. A, semiconductor device comprising:
a metal layer;
an n-type first silicon carbide region; and
a second silicon carbide region of metal containing at least one element selected from the group consisting of nickel (Ni), palladium (Pd), and platinum (Pt), and positioned between the metal layer and the first silicon carbide region, wherein
a work function of the second silicon carbide region is 3.7 eV or less.

7. A semiconductor device comprising:
a first electrode;
a second electrode;
a first silicon carbide region positioned between the first electrode and the second electrode;
an n-type second silicon carbide region positioned between the first silicon carbide region and the second electrode and having a higher n-type impurity concentration than that of the first silicon carbide region; and
a third silicon carbide region of metal containing at least one element selected from the group consisting of nickel (Ni), palladium (Pd), and platinum (Pt), and positioned between the second silicon carbide region and the second electrode.

8. The semiconductor device according to claim 7, wherein
the at least one element is present at a carbon site of a crystal structure of silicon carbide.

9. The semiconductor device according to claim 7, wherein the third silicon carbide region contains silicon (Si) present at a carbon site of a crystal structure of silicon carbide.

10. The semiconductor device according to claim 7, wherein
a concentration of the at least one element in the third silicon carbide region is $1\times10^{19}$ cm$^{-3}$ to $5\times10^{22}$ cm$^{-3}$.

11. The semiconductor device according to claim 7, wherein
a thickness of the third silicon carbide region is 0.01 μm to 1.0 μm.

12. The semiconductor device according to claim 7, wherein a sheet resistance of the third silicon carbide region is 0.5 Ω/☐ or less.

13. The semiconductor device according to claim 7, wherein a work function of the third silicon carbide region is 3.7 eV or less.

14. An inverter circuit comprising the semiconductor device according to claim 7.

15. A driving device comprising the semiconductor device according to claim 7.

16. A vehicle comprising the semiconductor device according to claim 7.

17. An elevator comprising the semiconductor device according to claim 7.

18. The semiconductor device according to claim 3, wherein
the at least one element is present at a carbon site of a crystal structure of silicon carbide.

19. The semiconductor device according to claim 3, wherein
the second silicon carbide region contains silicon (Si) present at a carbon site of a crystal structure of silicon carbide.

20. The semiconductor device according to claim 3, wherein
a sheet resistance of the second silicon carbide region is 0.5 Ω/☐ or less.

21. The semiconductor device according to claim 3, wherein
a work function of the second silicon carbide region is 3.7 eV or less.

22. The semiconductor device according to claim 1, wherein
a thickness of the second silicon carbide region is 0.01 μm to 1.0 μm.

23. The semiconductor device according to claim 2, wherein
a thickness of the second silicon carbide region is 0.01 μm to 1.0 μm.

24. The semiconductor device according to claim 5, wherein
a thickness of the second silicon carbide region is 0.01 μm to 1.0 μm.

25. The semiconductor device according to claim 6, wherein
a thickness of the second silicon carbide region is 0.01 μm to 1.0 μm.

* * * * *